US009564703B2

(12) United States Patent
Kaneko et al.

(10) Patent No.: US 9,564,703 B2
(45) Date of Patent: Feb. 7, 2017

(54) SCREW BLOCK INSTALLATION STRUCTURE FOR A JUNCTION BOX

(71) Applicant: YAZAKI CORPORATION, Tokyo (JP)

(72) Inventors: Nobutaka Kaneko, Makinohara (JP); Hiroki Tashiro, Makinohara (JP); Toshihiro Teranishi, Makinohara (JP); Takehisa Shinma, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 55 days.

(21) Appl. No.: 14/327,823

(22) Filed: Jul. 10, 2014

(65) Prior Publication Data

US 2014/0335724 A1     Nov. 13, 2014

Related U.S. Application Data

(63) Continuation of application No. PCT/JP2013/051015, filed on Jan. 11, 2013.

(30) Foreign Application Priority Data

Jan. 13, 2012   (JP) .................................. 2012-004860

(51) Int. Cl.
*H01R 9/22*     (2006.01)
*H01R 13/46*     (2006.01)
(Continued)

(52) U.S. Cl.
CPC ........... *H01R 13/46* (2013.01); *B60R 16/0238* (2013.01); *H01R 31/00* (2013.01); *H05K 7/026* (2013.01);
(Continued)

(58) Field of Classification Search
CPC ......... H01R 9/24; H01R 9/2675; H01R 13/26; H01R 13/631; H01R 13/6275; H01R 13/639
(Continued)

(56) References Cited

U.S. PATENT DOCUMENTS 5,011,421 A * 4/1991 Duke ....................... H02G 5/06
174/71 B
5,438,310 A * 8/1995 Ikari ...................... H01H 85/20
337/186

(Continued)

FOREIGN PATENT DOCUMENTS

JP    2004-236449 A    8/2004
JP    2008-154412 A    7/2008

OTHER PUBLICATIONS

International Search Report for PCT/JP2013/051015 dated Jul. 19, 2013 [PCT/ISA/210].
Written Opinion for PCT/JP2013/051015 dated Jul. 19, 2013 [PCT/ISA/237].

*Primary Examiner* — Hien Vu
(74) *Attorney, Agent, or Firm* — Sughrue Mion, PLLC

(57) ABSTRACT

A screw block installation structure for a junction box in which a screw block is installed to a screw block attaching portion having a screw block housing space in a component attachment block in a junction box, the component attachment block is housed together with the screw block inside a frame, and a connecting member is screw-connected to a screw member of the screw block, the screw member having a vertical axis of the screw block, wherein a lateral side opening is disposed in the screw block attaching portion, and the screw block is laterally installed to the screw block housing space through the side opening is provided.

14 Claims, 7 Drawing Sheets

(51) Int. Cl.
    *H05K 7/02*     (2006.01)
    *H01R 31/00*     (2006.01)
    *B60R 16/023*     (2006.01)
    *H01R 11/12*     (2006.01)
    *H01R 4/34*     (2006.01)
    *F16B 37/04*     (2006.01)
    *H01R 9/24*     (2006.01)

(52) U.S. Cl.
    CPC ................ *F16B 37/043* (2013.01); *H01R 4/34* (2013.01); *H01R 9/24* (2013.01); *H01R 11/12* (2013.01)

(58) Field of Classification Search
    USPC .......................... 439/712, 715, 709, 374, 953
    See application file for complete search history.

(56) References Cited

U.S. PATENT DOCUMENTS

| | | | |
|---|---|---|---|
| 6,679,708 B1 * | 1/2004 | Depp .................. | H01R 9/2466 |
| | | | 361/752 |
| 7,597,595 B2 * | 10/2009 | Ohashi .................. | H01R 11/12 |
| | | | 439/522 |
| 7,766,695 B1 * | 8/2010 | Czarnecki ............ | H01R 13/447 |
| | | | 174/58 |
| 2008/0124985 A1 * | 5/2008 | Matsumoto .......... | H05K 7/1432 |
| | | | 439/709 |
| 2008/0149387 A1 | 6/2008 | Oda | |
| 2009/0068894 A1 | 3/2009 | Ohashi et al. | |

\* cited by examiner

FIG.6A
FIG.6B
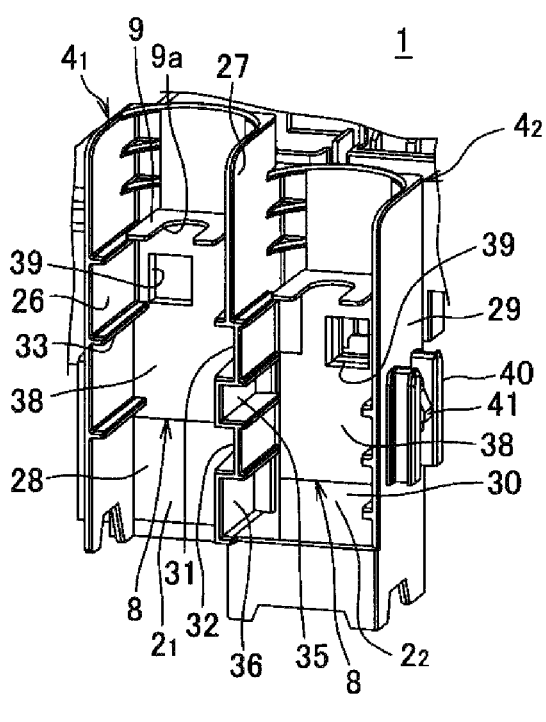
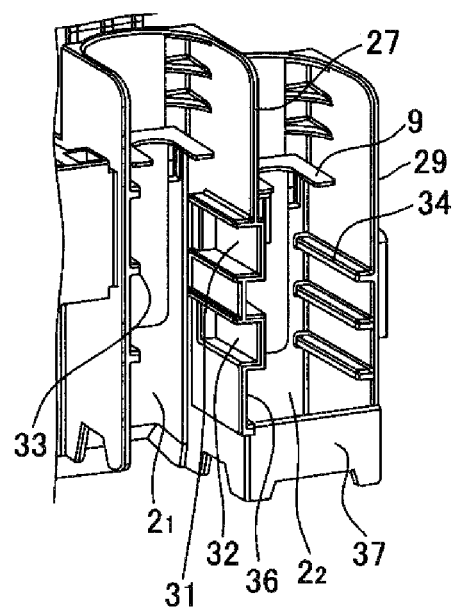

SCREW BLOCK INSTALLATION STRUCTURE FOR A JUNCTION BOX

CROSS REFERENCE TO RELATED APPLICATIONS

This application is a continuation of PCT application No. PCT/JP2013/051015, which was filed on Jan. 11, 2013 based on Japanese Patent Application (No. 2012-004860) filed on Jan. 13, 2012, the contents of which are incorporated herein by reference.

BACKGROUND OF THE INVENTION

1. Field of the Invention

The present invention relates to a screw block installation structure for a junction box. The installation structure is used for installing a screw block for screw-connecting a bus bar or a wire-equipped terminal in a junction box mounted on a vehicle or the like.

2. Description of the Related Art

Various junction box structures have been proposed in order to fasteningly connect a bus bar which is made of a conductive metal in a junction box, and which is in a junction box, and an external wire-equipped terminal, to a bolt upstanding in the junction box, by using a nut.

For example, PTL 1 discloses a configuration (not shown) where a protector additionally disposing portion is formed on a vertical side wall of a synthetic resin-made bottomed junction box body of a junction box, an upper end portion of the protector additionally disposing portion is cut away, a pair of right and left bus bars are placed in parallel in the cutaway (in the junction box body), the bus bars have bolt insertion holes, respectively, a pair of wire-equipped terminals are housed in a synthetic resin-made protector, and planer electric contacting portions of the wire-equipped terminals are screw-connected to the bus bars by bolts, respectively in a state where the electric contacting portions are projected from the protector to the outside.

Furthermore, PTL 2 discloses a configuration (not shown) where a bus bar, a relay, a fuse, and a fusible link are housed or mounted in a synthetic resin-made case body (frame) which vertically passes through a junction box, an external wire-equipped terminal is covered by a terminal cover, an electric contacting portion of the terminal which is projected from the terminal cover is screw-connected to a terminal portion of the bus bar, and an upper cover and a lower cover are attached to the case body.

As a junction box structure other than the above-described ones, there is a screw block installation structure for a junction box shown in FIG. 10. In the screw block installation structure, a bolt block (screw block) 73 including: a metal-made bolt 71 which is upward directed; and a synthetic resin-made block body 72 which fixes a lower portion of the bolt 71 is upward inserted from the lower side into a vacant chamber 75 which vertically passes through a synthetic resin-made component attachment block 74, to engage it.

An engagement arm (not shown) is upward projected in the vacant chamber 75 of the component attachment block 74, the bolt block 73 enters the vacant chamber 75 while outward deflecting the engagement arm, and then the engagement arm inward returns to, for example, engage the bottom surface of the bolt block 73. The component attachment block 74 is upward installed from the lower side together with the bolt block 73 to the inside of a synthetic resin-made frame (not shown). The bolt 71 is upward passed from the lower side through a bolt insertion hole of a bus bar which is made of a conductive metal, and which is previously installed into the frame, an external wire-equipped terminal (not shown) is passed over the bolt 71, and the bus bar and the wire-equipped terminal are fasteningly connected to each other from the upper side by a nut.

CITATION LIST

Patent Literature

[PTL 1] JP-A-2004-236449 (FIGS. 7 and 8)
[PTL 2] JP-A-2008-154412 (FIGS. 1 and 2)

In the screw block installation structure for a junction box shown in FIG. 10, the bolt block (screw block) 73 is upward inserted from the lower side into the vertical vacant chamber (hole) 75 of the component attachment block 74, and then engaged by engagement means such as the engagement arm in the component attachment block 74. Therefore, there are problems in that the work of inserting and engaging the bolt block 73 is cumbersome, and that the work of checking whether the bolt block 73 is surely inserted into the component attachment block 74 and surely engaged by the engagement means such as the engagement arm in the component attachment block or not is cumbersome.

In the case where the bus bar and the external wire-equipped terminal are fasteningly connected to the bolt (one screw member) 71 of the bolt block (screw block) 73 by the nut (other screw member), when the bolt block 73 is excessively downward pressed from the upper side by a screw wrench, there arises a problem in that the engagement arm in the vacant chamber 75 may outward deflect and the engagement of the bolt block 73 may be accidentally cancelled, thereby causing the bolt block 73 to drop off.

SUMMARY OF THE INVENTION

In view of the above-discussed problems, it is an object of the invention to provide a screw block installation structure for a junction box which enables a screw block to be installed easily and surely into a component attachment block, and in which, even when the screw block is strongly downward vertically pressed from the upper side by a screw wrench, accidental cancellation of engagement does not occur, and the screw block can be surely prevented from dropping off, and which allows connecting members such as a bus bar and a wire-equipped terminal to be fasteningly connected firmly and surely to the screw block.

In order to attain the object, according to the invention, there is provided a screw block installation structure for a junction box in which a screw block is installed to a screw block attaching portion having a screw block housing space in a component attachment block in a junction box, the component attachment block is housed together with the screw block inside a frame, and a connecting member is screw-connected to a screw member of the screw block, the screw member having a vertical axis of the screw block, wherein a lateral side opening is disposed in the screw block attaching portion, and the screw block is laterally installed to the screw block housing space through the side opening.

According to the configuration, the screw block attaching portion is opened to the outside through the side opening, and the screw block is laterally installed smoothly, easily, and surely into the screw block attaching portion under the view of the worker. In the case where the connecting member such as a bus bar is to be fasteningly connected to one screw member (for example, a bolt) of the screw block by an external other screw member (for example, a nut), when a screw wrench is downward (vertically) engaged with the other screw member (for example, a nut) from the upper side, a downward pressing force is applied to the screw block. However, the screw block is to be installed to the component attachment block in the lateral direction (the direction perpendicular to the pressing force acting on the screw block). Therefore, a strong receiving or supporting portion (for example, a lateral guiding portion for a lateral slide engaging portion of the screw block) for the screw block can be disposed in the screw block attaching portion, so that, even when a strong downward pressing force is applied, the screw block can be surely prevented from dropping off.

A guiding portion may be laterally disposed in the screw block attaching portion, and a lateral slide engaging portion which is slidingly engaged with the guiding portion may be disposed in the screw block.

According to the configuration, the screw block is smoothly installed laterally in a sliding manner into the screw block attaching portion through the side opening. The lateral (horizontal) slide engaging portion of the screw block is slidingly engaged with the lateral (horizontal) guiding portion in the screw block attaching portion. When a downward pressing force acts on the screw block, the lateral slide engaging portion of the screw block is firmly received by the lateral guiding portion in the block attaching portion, whereby the screw block can be surely prevented from dropping off.

A pair of screw blocks may be installed in an adjacent manner to screw block attaching portions, respectively, and guiding portions for the slide engaging portions on a side where the screw blocks are opposed to each other may be disposed alternately in a height direction in a common partition wall between the screw block attaching portions.

According to the configuration, the right slide engaging portion of the left screw block is slidingly engaged with the left guiding portion of the common partition wall, the left slide engaging portion of the right screw block is slidingly engaged with the right guiding portion of the common partition wall, and the guiding portions are placed while vertically overlapping each other. Therefore, the space for the screw block installation structure can be reduced or compactified in the arrangement direction of the screw blocks.

The side opening may be closed by a side wall of the frame.

According to the configuration, the side wall of the frame functions also as a side wall of the screw block attaching portion, and the screw block is isolated from the outside and protected from interference, a short circuit, and the like by the side wall of the frame. Moreover, the screw block is surrounded on four sides by three walls of the screw block attaching portion and one side wall of the frame, and firmly supported. Therefore, the screw block is blocked from being moved in the rotation direction by the rotational torque produced in a screwing operation.

In the side opening, an inner surface of the side wall of the frame may be adjacent to or in contact with an outer surface of the screw block.

According to the configuration, in the side opening of the screw block attaching portion, the outer surface of the screw block is supported by the inner surface of the side wall of the frame, and held by being surrounded on four sides by the side wall and the three walls of the screw block attaching portion, and the screw block is blocked from being moved in the rotation direction by the rotational torque produced in a screwing operation.

A vertical rib may be disposed on an inner surface of the side wall of the frame, and, in the side opening, the rib may be in contact with an outer surface of the screw block.

According to the configuration, in the side opening of the screw block attaching portion, the outer surface of the screw block is supported without rattling by the inner surface of the side wall of the frame, and surrounded on four sides by the side wall and the three walls of the screw block attaching portion, and the screw block is surely blocked from being moved in the rotation direction by the rotational torque produced in a screwing operation. In the case where the component attachment block to which the screw block is installed is to be vertically installed into the frame, the vertical rib is in smooth sliding contact with the inner surface of the side wall of the frame, thereby reducing the installation slide resistance of the component attachment block.

According to an aspect of the invention, the worker can visually check the screw block housing space through the side opening, and therefore the screw block can be installed easily and surely into the screw block attaching portion through the side opening. Even when the screw block is strongly vertically pressed by a screw wrench, the pressing direction and the installation direction of the screw block are perpendicular to each other. Therefore, a vertical engagement arm used in a related-art screw block attaching portion is not necessary, and a lateral strong guiding portion which receives the screw block can be disposed in the screw block attaching portion, whereby unexpected cancellation of engagement and dropping off of the screw block caused thereby can be surely prevented from occurring.

According to an aspect of the invention, the screw block can be laterally installed in a sliding manner with high workability into the screw block attaching portion through the side opening. When a downward pressing force acts on the screw block during a screwing operation, moreover, the lateral slide engaging portion of the screw block can be firmly received by the lateral guiding portion in the block attaching portion, whereby the screw block can be surely prevented from dropping off.

According to an aspect of the invention, the slide engaging portions on the side where the right and left screw blocks are opposed to each other are placed in parallel while overlapping each other in the height (vertical) direction along the guiding portions of the common partition wall, whereby the space for the screw block installation structure can be reduced or compactified in the arrangement direction of the screw blocks.

According to an aspect of the invention, the screw block is surrounded on four sides by three walls of the screw block attaching portion and the side wall of the frame, and firmly supported, whereby the screw block is blocked from being moved in the rotation direction by the rotational torque produced in a screwing operation, and connecting members such as a bus bar and a wire-equipped terminal are enabled to be fasteningly connected firmly and surely to the screw block.

According to an aspect of the invention, in the side opening of the screw block attaching portion, the outer surface of the screw block is supported by the inner surface of the side wall of the frame, and the screw block can be blocked from being moved in the rotation direction by the rotational torque produced in a screwing operation.

According to an aspect of the invention, in the side opening of the screw block attaching portion, the outer surface of the screw block is supported without rattling by the inner surface of the side wall of the frame, and the screw block can be surely blocked from being moved in the rotation direction by the rotational torque produced in a screwing operation. In the case where the component attachment block to which the screw block is installed is to be vertically installed into the frame, the vertical rib is in smooth sliding contact with the inner surface of the side wall of the frame, whereby the installation slide resistance of the component attachment block can be reduced.

BRIEF DESCRIPTION OF THE DRAWINGS

FIGS. 6A and 6B are perspective views showing states where a bolt block attaching portion of the component attachment block is viewed from an obliquely right side and an obliquely left side, respectively.

DETAILED DESCRIPTION OF THE EXEMPLARY EMBODIMENTS

FIGS. 1 to 9B show an embodiment of the screw block installation structure for a junction box of the invention.

Figure 1:
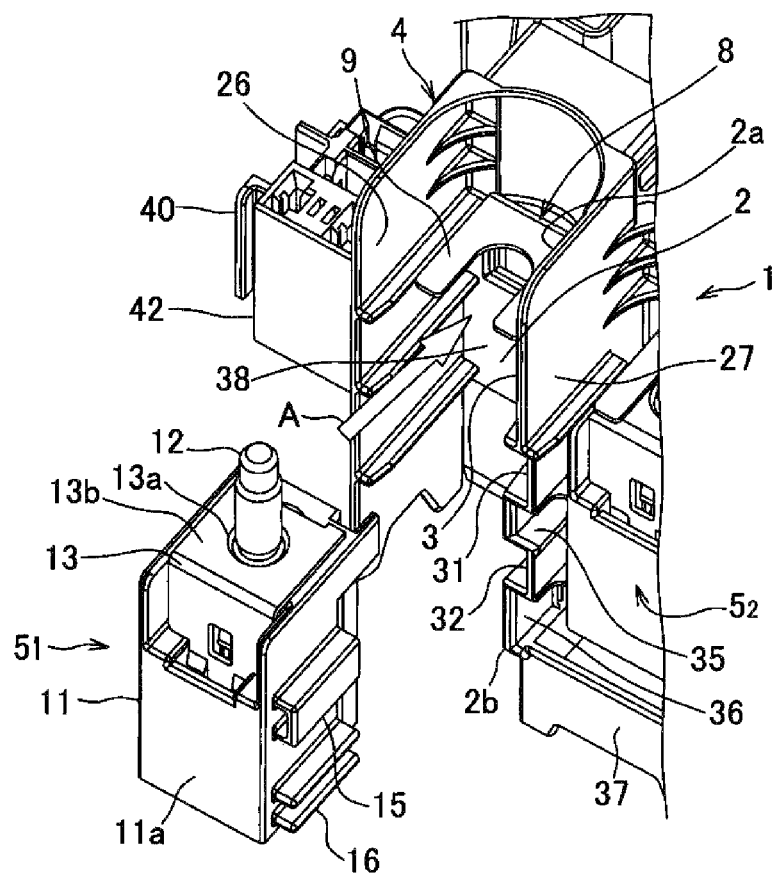
FIG. 1 is an exploded perspective view of a bolt block and a component attachment block showing an embodiment of the screw block installation structure for a junction box of the invention.

As shown in FIG. 1, in the screw block installation structure, a bolt block housing space (screw block housing space) 2 is disposed in a synthetic resin-made component attachment block 1 to be vertically passed therethrough (the upper and lower openings of the bolt block housing space 2 are denoted by 2a, 2b, respectively), and a side opening 3 through which one side of the bolt block housing space 2 is opened to the outside is disposed to configure a bolt block attaching portion (screw block attaching portion) 4, so that a bolt block (screw block) 5 is laterally (horizontally backward from the front side) inserted into the bolt block housing space 2 through the side opening 3 to be installed thereto.

Figure 2:
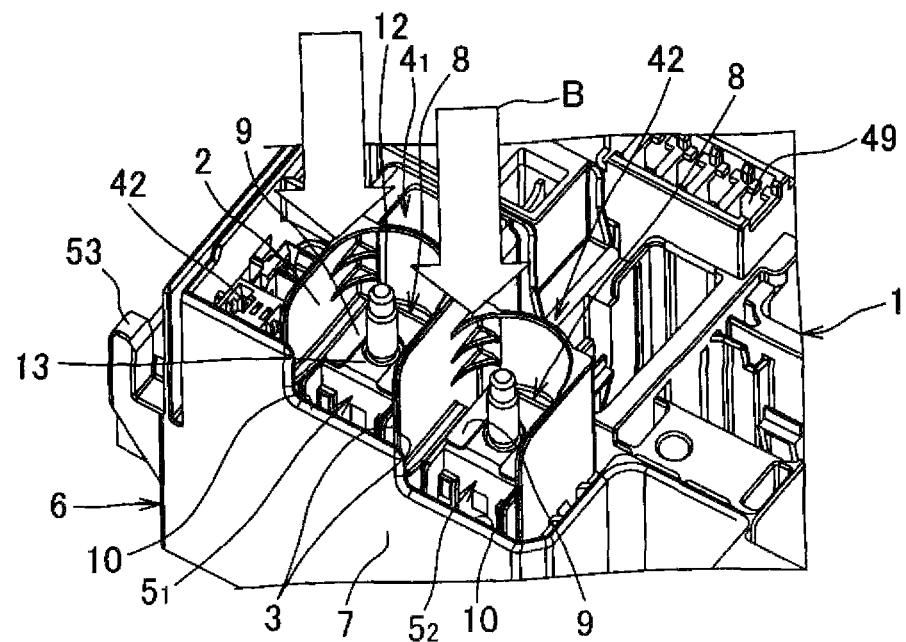
FIG. 2 is a perspective view showing a state where the component attachment block to which the bolt block is installed is housed in a frame.
Figure 3:
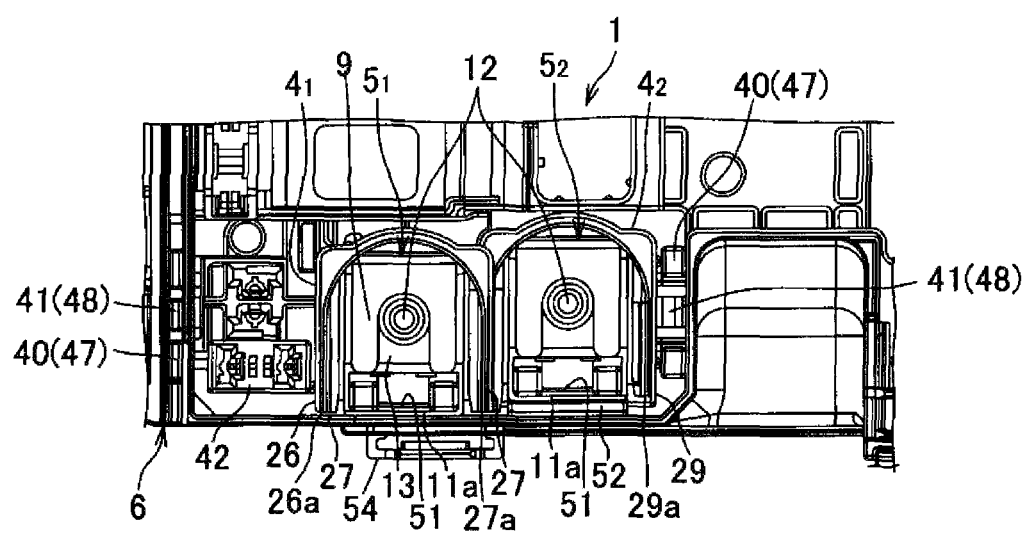
FIG. 3 is a plan view showing the state where the component attachment block to which the bolt block is installed is housed in the frame.

As shown in FIGS. 2 and 3, in a state where the bolt blocks 5 are installed to a pair of right and left bolt block attaching portions 4 of the component attachment block 1, a synthetic resin-made frame 6 is placed outside (the side) of the component attachment block 1 (the component attachment block 1 is installed by being upward inserted into the frame 6 from the lower side), and the side openings 3 of the bolt block housing spaces 2 of the component attachment block 1 are closed by the vertical side wall 7 of the frame 6 to configure one side walls (7) of the bolt block attaching portions 4. The side wall 7 of the frame 6 functions also as side walls of the bolt block attaching portions 4.

As shown in FIGS. 1 and 2, the pair of right and left bolt block attaching portions 4 are adjacently disposed in the component attachment block 1, and the bolt blocks 5 are inserted laterally (horizontally backward from the front side) thereinto through the side openings 3 of the bolt block housing spaces 2. Terminal portions 9 of conductive metal-made bus bars (connecting members) 8 and having a substantially U-like shape in a plan view are previously horizontally projected above the bolt block housing spaces 2. The bus bars 8 are rearward extended from the bolt block attaching portions 4 while passing inside the component attachment block 1.

The terminal portion 9 of each of the bus bars 8 is located slightly above the upper end of an upper cutaway portion 10 of the one side wall 7 of the frame 6. In the embodiment, the bolt blocks 5 are placed at slightly vertically different levels (the right bolt block 5 is placed at a lower level, and the left bolt block 5 is placed at a higher level). The terminal portions 9 of the bus bars 8 are placed in a similar manner.

As shown in FIG. 1, each of the bus bars 8 in the embodiment includes: the bolt block body 11 which is made of a synthetic (insulating) resin, and which has a substantially rectangular shape; a metal-made bolt 12 which is vertically upward projected from the upper surface of the bolt block body 11; and a conductive metal-made bus bar 13 which is placed while being bent into an L-like shape along the upper and front surfaces of the bolt block body 11, and which has a bolt insertion hole 13a in the upper surface. A terminal portion (not shown) of the bus bar 13 is projected into a vacant chamber (not shown) in the lower half of the bolt block body 11, so that a wire-equipped connector (not shown) for power supply distribution is connectable thereto from the lower side.

A wire-equipped terminal (connecting member) (not shown) for a power supply is fasteningly connected to the bolt 12 together with the terminal portion 9 of the bus bar 8 on the side of the component attachment block 1 by a nut (not shown). The right and left bolt blocks 5 are configured in a substantially same manner. For example, a power supply from a battery of a vehicle, and that from an alternator of the vehicle are separately input to the wire-equipped terminals (not shown) for a power supply which are fasteningly connected to the bolts 12 of the right and left bolt blocks 5.

Figure 4A:
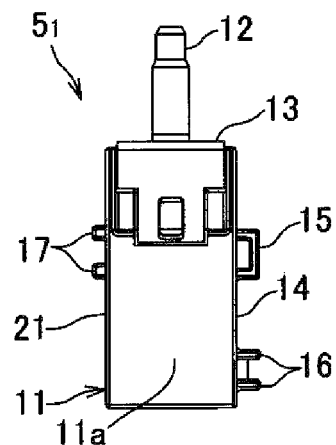
FIGS. 4A and 4B are front views showing right and left bolt blocks, respectively.

As shown in FIGS. 1 and 4A, in the bolt block body 11 of the left bolt block 5 ($5_1$), an upper large slide engaging portion 15 having a U-like sectional shape, and lower slide engaging portions 16 respectively configured by two upper and lower parallel ribs are horizontally disposed on the outer surface of the right wall 14, and upper slide engaging portions 17 respectively configured by two parallel two and lower ribs are horizontally disposed on the outer surface of the left wall 21.

Figure 4B:
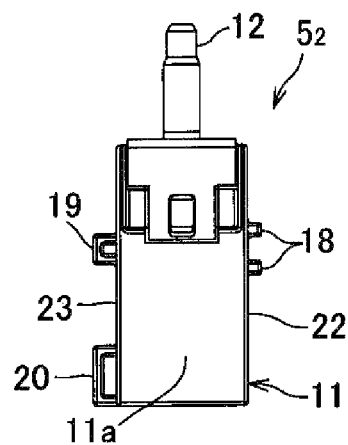

As shown in FIG. 4B, in the bolt block body 11 of the right bolt block 5 ($5_2$), upper slide engaging portions 18 respectively configured by two parallel upper and lower plates are horizontally disposed on the outer surface of the right wall 22, and an upper small slide engaging portion 19 having a U-like sectional shape, and a lower large slide engaging portion 20 having a U-like sectional shape are horizontally disposed on the outer surface of the left wall 23.

In the right and left bolt blocks 5, the slide engaging portions 15 to 20 are different in shape and size from one another. Therefore, the right and left bolt blocks 5 are prevented from being erroneously installed to the right and left bolt block housing spaces 2 of the component attachment block 1 (FIG. 2) (for example, the left bolt block 5₁ is installed to the left side, or the bolt blocks 5 are installed while reversing the front and rear (top and back) sides).

Figure 5:
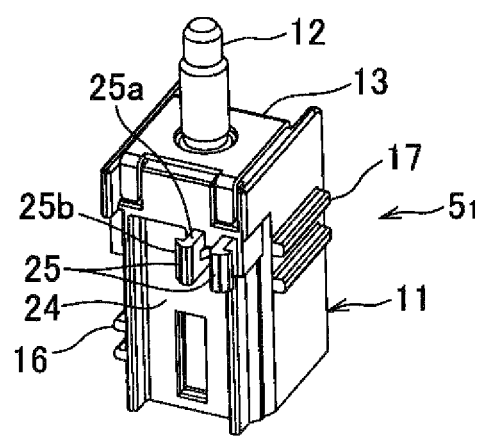
FIG. 5 is a perspective view of a state where a bolt block is viewed from the back surface side.

As shown in FIG. 5, a pair of right and left flexible engagement claws (engagement means) 25 for the component attachment block 1 (FIGS. 6A and 6B) are projected in a bilaterally symmetrical manner from an upper portion of the outer surface of the rear wall (back wall) 24 of the bolt block body 11 of each of the bolt blocks 5. The claws 25 have outward directed claw bodies 25b in the projection ends of flexible parallel plate pieces 25a, respectively. Each of the claw bodies 25b has an inclined surface and an engagement surface which is substantially perpendicular.

As shown in FIGS. 6A and 6B, the bolt block housing spaces 2 of the right and left bolt block attaching portions 4 are surrounded by right and left vertical walls 26, 27, 29 and rear walls 28, 30 to be configured to have a substantially U-like sectional shape. The partition wall (common partition wall) 27 between the bolt block housing spaces 2 is shared by the spaces. Receiving portions (receiving or supporting portions) 31 to 36 are horizontally disposed in the right and left bolt block housing spaces 2 of the component attachment block 1, correspondingly with the slide engaging portions 15 to 20 of the right and left bolt blocks 5 (FIGS. 4A and 4B).

As shown in FIG. 6A, a horizontal guide rib (guiding portion) 33 which is to be engaged between the pair of upper and lower slide engaging portions 17 on the left side in FIG. 4A is disposed on the inner surface of the left vertical wall 26 of the left bolt block housing space 2, and, as shown in FIG. 6B, upper and lower horizontal guide grooves (guiding portion) 31, 32 which are to be engaged with the upper and lower slide engaging portions 15, 16 on the right side in FIG. 4A, respectively are disposed on the right vertical wall (partition wall) 27 of the left bolt block housing space 2.

As shown in FIG. 6A, upper and lower horizontal guide grooves (guiding portion) 35, 36 which are to be engaged with the upper and lower slide engaging portions 19, 20 on the left side in FIG. 4B, respectively are disposed on the left wall (partition wall) 27 of the right bolt block housing space 2, and the upper and lower guide grooves 35, 36 and the upper and lower horizontal guide grooves (guiding portion) 31, 32 of the right side of the left bolt block housing space 2 are placed so as to form a rectangular waveform shape. Since the guiding portions 31, 32, 35, 36 for the right and left bolt blocks 5 are formed by using the common partition wall 27 as described above, the space of the installation structure for the bolt blocks 5 is reduced.

In a lower portion of the right bolt block housing space 2, the left and right walls 27, 29 are coupled to each other and reinforced by a short vertical front wall 37. As shown in FIG. 6B, a horizontal guide rib (guiding portion) 34 which is engaged between the pair of upper and lower slide engaging portions 18 of the right side in FIG. 4B is disposed on the right wall 29 of the right bolt block housing space 2. As shown in FIG. 6A, rectangular holes 39 with which the pairs of right and left claws 25 of the rear walls 24 of the bolt blocks 5 of FIG. 5 are passingly engaged are passed through and formed in the vertical rear walls 28, 30 of the right and left bolt block housing spaces 2, and vertical plates 38 of the bus bars (connecting members) 8 which extend along the front surfaces (inner surfaces) of the rear walls 28, 30. The claws 25 are passed through the holes 39 to be engaged with the rear surfaces (back surfaces) of the rear walls 28, 30, respectively.

Each of the vertical plates 38 of the bus bars 8 continues to a rearward extended portion (not shown) which is in rear of the one end, and also to the horizontal terminal portion 9 in the upper end. The terminal portion 9 has a slot hole 9a for bolt insertion in the middle. A pair of front and rear vertical slide engaging portions 40 for the frame 6 (FIG. 7) and having an L-like sectional shape, and an engagement arm (engagement portion) 41 which is between them are disposed on each of the outer surface of the right wall 29 of the right bolt block housing space 2, and the left outer wall of a relay attaching portion 42 which is disposed integrally with the outer surface of the left wall 26 of the bolt block housing space 2 on the left side in FIG. 1.

As indicated by the arrow A in FIG. 1, the horizontal slide engaging portions 15 to 20 of the right and left walls of the bolt blocks 5 are slidingly engaged in a lateral direction along the horizontal guiding portions 31 to 36 in the bolt block attaching portions 4 of the component attachment block 1. In a state where the component attachment block 1 is installed into the frame 6 as shown in FIG. 2, even when, during an operation of connecting an upper plate portion 13a of the bus bar 13, the terminal portion 9 of the bus bar 8, and an external wire-equipped terminal (not shown) to the upper bolts 12 of the bolt blocks 5 by fastening of a nut, a downward press load is applied to the bolt blocks 5 by a wrench (not shown) as indicated by the arrows B, therefore, the horizontal slide engaging portions 15 to 20 are firmly received by the horizontal guiding portions 31 to 36, so that the bolt blocks 5 are surely blocked from dropping off from the bolt block attaching portions 4.

Figure 7:
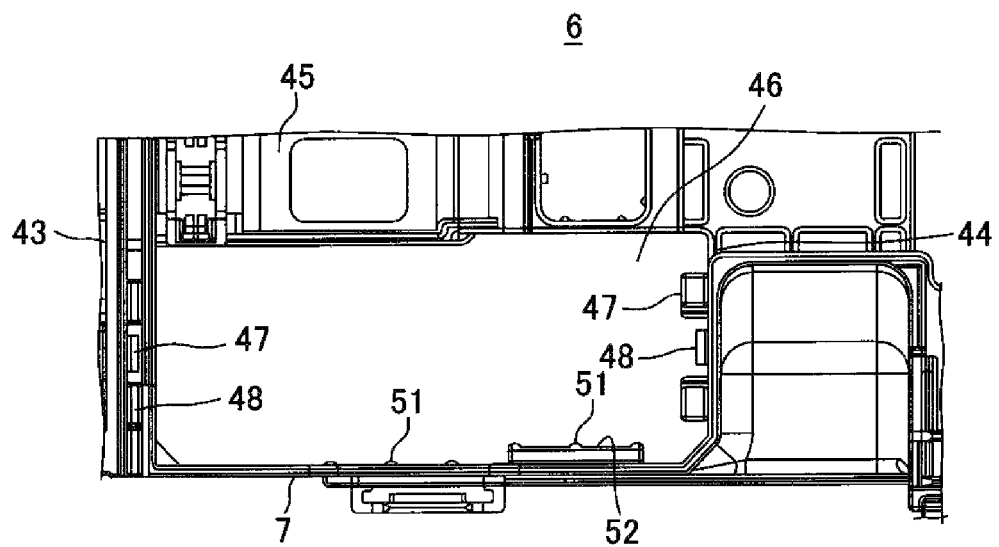
FIG. 7 is a plan view showing the frame.
Figure 8:
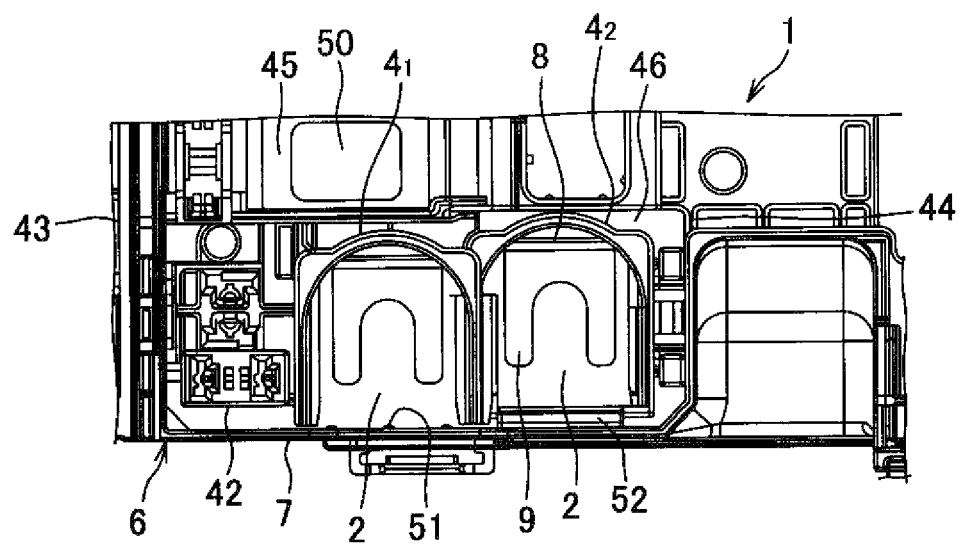
FIG. 8 is a plan view showing a state where the component attachment block is housed in the frame.

FIG. 7 shows a part (main portion) of the frame 6, and FIG. 8 shows a state where the component attachment block 1 is upward installed from the lower side into the frame 6 (a state where the bolt blocks 5 have not yet been attached). Actually, as shown in FIG. 3, the component attachment block 1 in a state where the bolt blocks 5 have been attached is installed into the frame 6.

As shown in FIG. 7, the frame 6 has a rectangular space 46 which is surrounded by a front vertical wall (one side wall), left and right vertical walls 43, 44, and an upper horizontal wall 45 on the rear side, and which vertically passes through the frame (the space 46 has upper and lower openings). As shown in FIG. 8, the bolt block attaching portions 4 of the component attachment block 1 of FIGS. 6A and 6B are upward inserted into the space 46 of the frame 6 in the state where the bolt blocks 5 are installed as shown in FIG. 3, and locked by engagement means 41, 48.

As shown in FIG. 7, a pair of vertical guide rails 47 having an inverted L-like sectional shape, and an engagement projection 48 formed between the rails are disposed on the inner surface of each of the right and left walls 43, 44 of the space 46, and the right and left guide rails 40 and engagement arms 41 (FIG. 6A) of the bolt block attaching portions 4 are slidingly engaged with the guide rails 47 and the engagement projections 48. The engagement arms 41 and the engagement projections 48 constitute the engagement means.

The component attachment block 1 in the embodiment is integrally configured by the right and left bolt block attaching portions 4, the plurality of relay attaching portions 42, a plurality of fuse attaching portions 49 (FIG. 2), a plurality of fusible link attaching portions 50, vertical bus bar attaching portions (not shown) (attaching grooves) which are disposed in the lower halves of the fuse attaching portions 49 and the fusible link attaching portions 50, and a lower connector attaching portion. A pair of wire-equipped terminals (not shown) are connected to vertical plates (not shown) of the bus bars 8 attached into the bus bar attaching grooves, by fastening bolts in rear of the bolt block attaching portions 4.

As shown in FIG. 7, on the inner surface of the front wall 7 of the frame 6, a plurality (in the embodiment, three for each bolt block) of ribs 51 are disposed in opposition to the housing spaces 2 of the right and left bolt block attaching portions 4 in FIG. 8. Because the right bolt block attaching portion 4$_2$ is placed while being slightly retracted from the left bolt block attaching portion 4$_1$, the ribs 51 corresponding to the right housing space 2 are disposed through a thick projecting wall 52 on the inner surface of the projecting wall 52. The projecting wall 52 is disposed on the inner surface of the front wall 7.

Figure 9A:
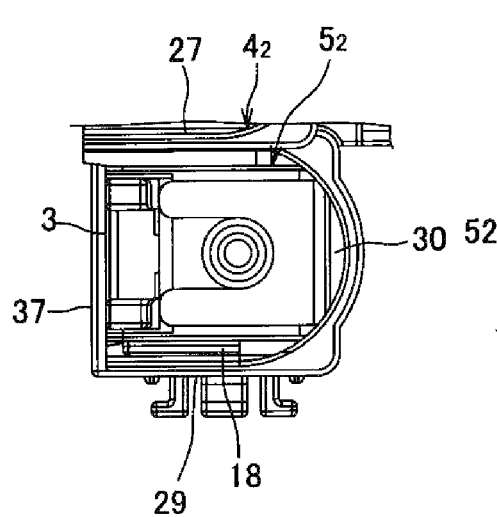
FIG. 9A is a plan view of a state where the bolt block is installed to the component attachment block.
Figure 9B:
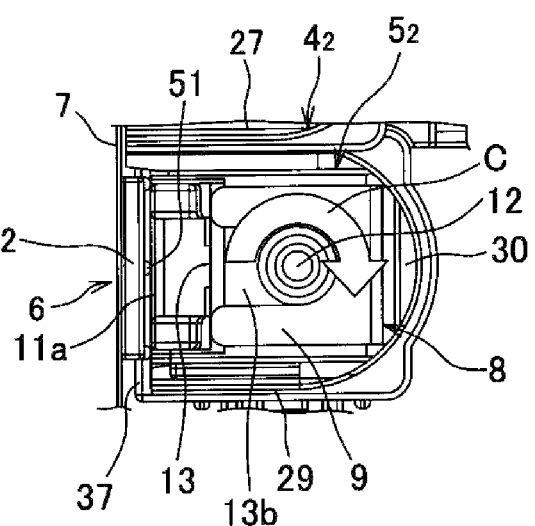
FIG. 9B is a plan view of a state where the component attachment block to which the bolt block is installed is housed in the frame.
Figure 10:
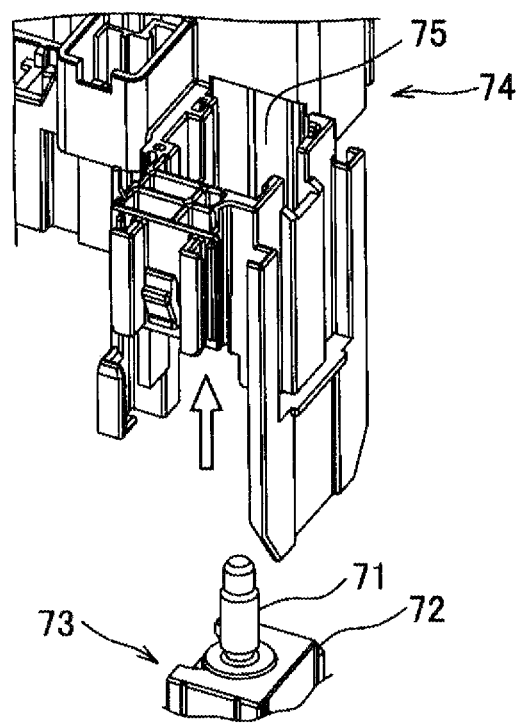
FIG. 10 is an exploded perspective view showing a mode of a related-art screw block installation structure for a junction box.

As shown in FIGS. 3 and 9B, the ribs 51 are contacted and abutted against the front wall surfaces 11a of the bolt block bodies 11 (FIGS. 4A and 4B) of the bolt blocks 5. When the component attachment block 1 to which the bolt blocks 5 are laterally (in the direction of the arrow A in the FIG. 1) attached is to be upward installed into the frame 6 from the lower side, the ribs 51 on the inner surface on the side of the front wall 7 of the frame 6 are in low-friction sliding contact with the front wall surfaces 11a of the bolt block bodies 11 of the bolt blocks 5, and the bolt block attaching portions 4 are enabled to be smoothly inserted into the rectangular space 46 of the frame 6. FIGS. 9A and 9B show the right bolt block 5$_2$, FIG. 9A shows the state where the component attachment block has not yet been attached to the frame, and FIG. 9B shows the state where the component attachment block has been attached to the frame 6.

As shown in FIG. 3, the front wall surface 11a of the bolt block body 11 of the left bolt block 5$_1$ which is laterally inserted into the left bolt block attaching portion 4$_1$ is located on the same vertical plane as the front end surfaces 26a, 27a of the left and right vertical walls 26, 27 of the left bolt block attaching portion 4$_1$. As shown in FIGS. 3 and 9A, the front wall surface 11a of the bolt block body 11 of the right bolt block 5$_2$ is located on the same vertical plane as the front end surface 29a of the right vertical wall 29 of the right bolt block attaching portion 4$_2$. This is similarly applicable also to the state (FIG. 9A) where the component attachment block has not yet been attached to the frame 6.

When the component attachment block is installed to the frame 6, the front end surfaces 26a, 27a of the left and right vertical walls 26, 27 of the left bolt block attaching portion 4$_1$ are in proximity to the inner surface of the front wall 7 of the frame 6 while leaving a small gap as shown in FIGS. 3 and 8, and the ribs 51 on the inner surface of the front wall 7 of the frame 6 are contacted and abutted against the front wall surface (outer surface) 11a of the bolt block body 11 of the left bolt block 5$_1$ as shown in FIG. 3 to press the bolt block 5$_1$ rearward (toward the vertical plate 38 of the bus bar 8 which extends along the rear wall 28 of the bolt block attaching portion 4$_1$ in FIG. 6A), thereby firmly supporting the bolt block.

With respect to the right bolt block 5$_2$ which is located slightly rearward from the left bolt block 5$_1$, when installed to the frame 6 (FIG. 9B) in the state of FIG. 9A where the component attachment block has not yet been attached to the frame (the reference numeral 37 denotes the lower coupling wall of the right bolt block attaching portion 4$_2$, and 3 denotes the side opening), the ribs 51 on the inner surface of the projecting wall 52 on the side of the front wall 7 of the frame 6 are contacted and abutted against the front wall surface (outer surface) 11a of the bolt block body 11 of the bolt block 5$_2$ in a space between the left and right walls 27, 29 of the bolt block attaching portion 4$_2$ to press the bolt block 5$_2$ rearward (toward the vertical plate 38 of the bus bar 8 which extends along the rear wall 30 of the bolt block attaching portion 4$_2$ in FIG. 6A), thereby firmly supporting the bolt block.

According to the configuration, the bolt block 5$_2$ is surrounded and supported on four sides by the front, rear, right, and left walls 7 (52), 30, 27, 28, i.e., the left and right walls 27, 29 of the bolt block attaching portion 4$_2$ and the projecting wall 52 of the front wall 7 of the frame 6 (the left bolt block 5$_1$ is surrounded and supported by the front wall 7 not having the projecting wall 52). Even in the case where, when a nut (not shown) is screwed to the bolt 12 of the bolt block 5 by using a screw wrench as indicated by the arrow C in FIG. 9B to fasteningly connect the upper surface 13b of the bus bar 13, the terminal portion 9 of the bus bar 8, and an external wire-equipped terminal (not shown) to one another, a large torque in a clockwise direction indicated by the arrow C is applied to the bolt block 5$_2$, therefore, the bolt block 5 is blocked from being moved in the direction of the arrow C (rotation direction), and the work of fastening the nuts, i.e., interconnection of the bus bar 13 of the upper surface of each bolt block 5, the terminal portion 9 of the bus bar 8 on the side of the component attachment block 1, and an external wire-equipped terminal (not shown) is performed smoothly and surely.

Alternatively, the ribs 51 may not be disposed on the inner surface on the side of the front wall 7 of the frame 6, and the inner surface on the side of the front wall 7 of the frame 6 may be adjacent to or in contact with the outer surface of the bolt block body 11 of each bolt block 5. The inner surface on the side of the front wall 7 of the frame 6 means the inner surface of the front wall 7 of the frame 6 corresponding to the left bolt block 5$_1$, and the inner surface of the projecting wall 52 which is inside the front wall 7 of the frame 6 corresponding to the right bolt block 5$_2$.

For example, the external wire-equipped terminals (not shown) are routed downward or laterally from the upper side along the outer surface of the front wall 7 of the frame 6 in front of the bolt blocks 2 in FIG. 2. Preferably, the external wire-equipped terminals are housed inside a synthetic resin-made side cover (not shown), and planer electric contacting portions of the wire-equipped terminals are projected from slit-like holes of the side cover toward the bolts 12. In FIG. 2, the reference numeral 53 denotes a left engagement portion for the side cover.

The frame 6 in FIG. 2 houses also a plurality of component attachment blocks such as those having a relay attaching portion (not shown), in addition to the component attachment block 1 having the bolt block attaching portions 4. Upper and lower covers are attached to the upper and lower ends of the frame 6 housing the plurality of component attachment blocks, and wires connected to terminals of a fuse, fusible link, relay, and the like attached to the component attachment blocks are led out to the outside from openings of the lower cover, thereby configuring a junction box. In FIG. 3, the reference numeral 54 denotes an engagement portion of the frame 6 for the lower cover.

Although, in the embodiment, the bolt block 5 in which the bolt 12 upstands from and is fixed to the synthetic resin-made bolt block body 11 is used as the screw block, a nut block in which, in place of the bolt 12, a nut (not shown) is fixed into the block body may be used, and a bolt (not shown) may be screwed to the nut while the head of the bolt is upward directed.

In the case, in a state where the bolt is temporarily fastened to the nut, the terminal 9 of the bus bar 8, and the wire-equipped terminal (not shown) are installed to the bolt, and then the bolt is finally tightened to interconnect the bus bar 13 on the side of the nut block and the connecting members 8, 9. A configuration having the bolt 12 or the nut (not shown) is generally referred to as the screw block 5. The bolt 12 or the nut (not shown) is placed in the screw block 5 so that the axis of the bolt 12 or the nut (not shown) is vertically directed.

In the embodiment, the bolt block 5 having the bus bar 13 is used. Alternatively, the bus bar 13 of the bolt block 5, and a connector portion in the lower half may be omitted, and, by using a bolt block merely configured so that the bolt 12 upstands from the synthetic resin-made bolt block body 11, the bus bar 8 on the side of the component attachment block 1 and the external wire-equipped terminal may be interconnected. This is similarly applicable also to the case of a nut block. In the specification, the front, rear, right, and left directions are indicated for the sake of convenience in description, and do not always coincide with the installation direction of the screw block 5.

The screw block installation structure for the junction box of the invention enables a screw block to be installed easily and surely into a component attachment block, surely prevents dropping off of the screw block in the case where the screw block is strongly downward pressed from the upper side by a screw wrench, from occurring, and can be used for fasteningly connecting a bus bar and a wire-equipped terminal surely and firmly to the screw block.

What is claimed is:

1. A screw block installation structure, of a junction box in which a screw block is installed to a screw block attaching portion, the screw block installation structure comprising:
    a screw block housing space in a component attachment block in the junction box;
    a bus-bar connected to a bolt, of the screw block, the bolt extending in a direction along a vertical axis of the screw block;
    a common partition wall formed between the screw block attaching portion and a second screw block attaching portion, wherein
    a lateral side opening is disposed in the screw block attaching portion, and the screw block is laterally installed to the screw block housing space through the lateral side opening, by a slidable engagement of a plurality of lateral slide engaging portions, of the screw block, to engage with a plurality of guiding portions of the screw block attaching portion, wherein
    the lateral slide engaging portions are disposed at different positions along the vertical axis,
    the component attachment block is housed together with the screw block inside a frame, and
    the plurality of guiding portions protrude from the common partition wall further comprising a second plurality of guiding portions configured to guide a second screw block into the second screw block attaching portion.

2. The screw block installation structure according to claim 1, wherein at least one of the guiding portions is laterally disposed in the screw block attaching portion, and
    at least one of the lateral slide engaging portions is slidingly engaged with the one of the guiding portions disposed in the screw block.

3. The screw block installation structure according to claim 2, further comprising:
    a pair of screw blocks installed in an adjacent manner to screw block attaching portions, respectively; and
    the guiding portions for the lateral slide engaging portions on a side, where the screw blocks are opposed to each other are disposed alternately in a height direction in the common partition wall between the screw block attaching portion and the second screw block attaching portion.

4. The screw block installation structure according to claim 1, wherein the lateral side opening is closed by a side wall of the frame.

5. The screw block installation structure according to claim 4, wherein, in the lateral side opening, an inner surface of the side wall of the frame is adjacent to or in contact with an outer surface of the screw block.

6. The screw block installation structure according to claim 4, wherein a vertical rib is disposed on an inner surface of the side wall of the frame, and in the lateral side opening, the vertical rib is in contact with an outer surface of the screw block.

7. The screw block installation structure according to claim 1, wherein the bolt extends along the vertical axis, of the screw block, which is perpendicular to a direction in which the screw block is inserted into the attachment block.

8. The screw block installation structure according to claim 1, wherein the lateral slide engaging portions comprise pairs of ribs, and
    wherein the pairs of ribs are parallel to each other and extend along a horizontal axis of the screw block on a plurality of sides of the screw block.

9. The screw block installation structure according to claim 1, wherein the screw block further comprises locking claws which extend through a wall of the component attachment block and lock thereto.

10. The screw block installation structure according to claim 1, wherein the bus bar is a metal bus bar, having a U-shape, which surrounds the bolt inside a cavity of the metal bus bar.

11. The screw block installation structure according to claim 1, wherein the second screw block is installed in the second screw block attaching portion by at least a second slidable engagement of a plurality of second lateral slide engaging portions, of the second screw block, and the plurality of second guiding portions, in a second screw block housing space of the screw block attaching portion, and
    wherein the second lateral slide engaging portions are arranged differently on the second screw block than the lateral slide engaging portions are arranged on the screw block.

12. The screw block installation structure according to claim 11, wherein the screw block housing space and the second screw block housing space share the common partition wall, and
    wherein respective sides of the common partition wall, each facing a respective one of the screw block housing space and the second screw block housing space, comprise at least a plurality of each of the guiding portions and the second guiding portions each formed as a rectangular waveform extending along the vertical axis of the common partition wall.

13. The screw block installation structure according to claim 1, wherein
    the second screw block is laterally installed to the screw block housing space through the second lateral side opening by a slidable engagement of a plurality of second lateral slide engaging portions, of the second screw block, to the plurality of second guiding portions protruding from the common partition wall of the screw block attaching portion.

14. The screw block installation structure according to claim 13, wherein
the second screw block is arranged at an alternate position along the vertical axis than the screw block.

* * * * *